US012733412B2

(12) United States Patent
Ando et al.

(10) Patent No.: US 12,733,412 B2
(45) Date of Patent: Sep. 8, 2026

(54) METAL FERROELECTRIC INSULATOR METAL STACK IN RRAM

(71) Applicant: International Business Machines Corporation, Armonk, NY (US)

(72) Inventors: Takashi Ando, Eastchester, NY (US); Reinaldo Vega, Mahopac, NY (US); Nicholas Anthony Lanzillo, Wynantskill, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 565 days.

(21) Appl. No.: 18/133,304

(22) Filed: Apr. 11, 2023

(65) Prior Publication Data

US 2024/0349631 A1 Oct. 17, 2024

(51) Int. Cl.
*H10N 70/00* (2023.01)
*H10B 63/00* (2023.01)

(52) U.S. Cl.
CPC ......... *H10N 70/8833* (2023.02); *H10B 63/34* (2023.02); *H10N 70/021* (2023.02); *H10N 70/826* (2023.02); *H10N 70/841* (2023.02)

(58) Field of Classification Search
CPC ............. H10N 70/8833; H10N 70/826; H10N 70/841; H10N 70/021; H10B 63/34
See application file for complete search history.

(56) References Cited

U.S. PATENT DOCUMENTS

| | | | | |
|---|---|---|---|---|
| 10,128,327 | B2 | 11/2018 | Zhang et al. | |
| 10,170,520 | B1 | 1/2019 | Frougier et al. | |
| 10,475,514 | B2 | 11/2019 | Li et al. | |
| 11,538,520 | B1 | 12/2022 | Cheng et al. | |
| 11,672,129 | B2 * | 6/2023 | Kabuyanagi ......... | H10N 70/826 257/295 |
| 2014/0153312 | A1 | 6/2014 | Sandhu et al. | |
| 2015/0333258 | A1 | 11/2015 | Fujii et al. | |

(Continued)

OTHER PUBLICATIONS

Benatti, L. et al., "Understanding the Reliability of Ferroelectric Tunnel Junction Operations using an Advanced Small-Signal Model", IEEE International Integrated Reliability Workshop, Oct. 4-28, 2021, 7 pages.

(Continued)

*Primary Examiner* — Mark V Prenty
(74) *Attorney, Agent, or Firm* — Harrity & Harrity, LLP

(57) ABSTRACT

A memory structure that includes a dielectric stack of a ferroelectric dielectric layer and a paraelectric dielectric layer. At least the ferroelectric dielectric layer produces a negative capacitance to amplify an applied voltage. A thickness of the ferroelectric dielectric layer and the paraelectric dielectric layer results in simultaneous breakdown of a dielectric material in each of the ferroelectric dielectric layer and the paraelectric dielectric layer for the formation of conductive filaments upon being exposed to an electric field produced by the applied voltage amplified by the negative capacitance. The memory structure also includes a first electrode at a first end of the dielectric stack, and a second electrode at a second end of the dielectric stack. The applied voltage is applied to the memory structure through at least one of the first electrode and the second electrode.

13 Claims, 7 Drawing Sheets

(56) References Cited

U.S. PATENT DOCUMENTS

| | | | | |
|---|---|---|---|---|
| 2019/0181336 | A1 | 6/2019 | Lee | |
| 2021/0408013 | A1 | 12/2021 | Young et al. | |
| 2022/0392995 | A1 | 12/2022 | Ando et al. | |
| 2024/0349631 | A1* | 10/2024 | Ando | H10N 70/841 |

OTHER PUBLICATIONS

Esseni, D., et al., Ferroelectric based FETs and synaptic devices for highly energy e cient computational technologies, arXiv:2105.00864v1 [cs.ET], May 4, 2021, 10 pages.

International Searching Authority, Notification of Transmittal of the International Search Report and the Written Opinion of the International Searching Authority, Jun. 11, 2024, 17 pages, International Application No. PCT/EP2024/056721.

Max, et al., Ferroelectric Tunnel Junctions based on Ferroelectric-Dielectric Hf0.5Zr0.5.O2/ A12O3Capacitor Stacks, 48th European Solid-State Device Research Conference (ESSDERC), Sep. 3-6, 2018, pp. 142-145.

Hoffmann et al., "Demonstration of high-speed hysteresis-free negative capacitance in ferroelectric Hf 0.5 Zr 0.5 O 2" in 2018 IEEE International Electron Devices Meeting (IEDM), Dec. 2018, pp. 31-36.

Taiwan Patent Office, "First office action," Dec. 5, 2024, 4 Pages, TW Application No. 113103276.

Intellectual Property Office, "Request for the Submission of an Opinion," Mar. 9, 2026, 13 Pages, KR Application No. 10-2025-7024341.

European Patent Office, "EP Examination Report", Jun. 9, 2026, 04 pages, EP Application No. 24712021.5.

European Patent Office, "Reply to Examination Report", Jul. 8, 2026, 02 pages, EP Application No 24712021.5.

* cited by examiner

METAL FERROELECTRIC INSULATOR METAL STACK IN RRAM

BACKGROUND

The present invention relates generally to memory devices and, in particular, to a resistive switching memory stack.

Resistive random access memory (RRAM or ReRAM) is one example of non-volatile memory uses variable resistance memory elements that can be set to either low or high resistance states, and can remain in that state until subsequently reset to an initial condition.

RRAM systems employ a metal-insulator-metal (MIM) structure for the electrically stimulated change of the resistance, and this configuration is often referred to as a 1-resistor or 1R configuration. The resistance change behavior for bi-polar operation of filament-based RRAM switching, where an ohmic Low Resistance 'ON' state (LRS), or a non-ohmic High Resistance 'OFF' state (HRS), can be related to the formed conductive filament (CF) or its rupture, respectively.

The CF forming process in $HfO_2$ can be discussed in terms of dielectric breakdown (BD), an abrupt formation of a localized region between the electrodes, within which the dielectric composition becomes more oxygen-deficient, rendering this region conductive (the CF formation). Some dc switching operations for filament-based RRAM include: (1) Forming: a dielectric breakdown event leading to a CF; the voltage of the abrupt breakdown (forming) is termed $V_F$; (2) Reset operation: where the device changes from the LRS to the HRS state due to rupture of the CF; and (3) Set operation: where the device changes from the HRS to the LRS state due to re-formation of the CF path.

However, RRAM devices are formed using a high voltage forming step for producing the current conducting filaments (CF). The forming phenomena is similar to oxide breakdown. The forming phenomena includes the application of a high electric field across the dielectric, e.g., oxide, in which the filament is formed. In some examples, the voltage that is employed to form the filaments is higher than voltage employed in other operations, such as programming and sensing. For example, the voltage for forming filaments can be on the order of 2 volts.

In has been determined, that the voltage used in forming filaments for RRAM devices can have a negative impact on non-volatile memory (NVM) technologies that are integrated with other types of microelectronic devices, such as complementary metal oxide (CMOS) devices that are designed for operation at lower voltages than those used for forming the filaments. For example, a voltage that is employed for forming filaments at a value of 2 volts may have a negative impact on CMOS devices that are designed to operate at 1 volt. Previously, in view of the high forming voltage of the RRAM devices, to integrate CMOS devices, the CMOS devices needed to be larger or be connected in series in order to handle the higher voltages of the forming steps for the filaments of the RRAM devices. Both of these options negatively result in a larger footprint within the active area of a device, which can negatively limit scalability.

SUMMARY

In view of the aforementioned disadvantages of high voltage forming steps for producing filaments in RRAM devices that can negatively impact microelectronics designed for lower voltages, what is needed is a RRAM device including filaments that are formed at lower voltages. In some embodiments, a lower voltage is enabled for forming conductive filaments through the dielectric layer of a RRAM device by employing negative capacitance to increase the internal voltage of the device to a value that is greater than the actual applied voltage. More particularly, it has been determined that negative differential capacitance (NDC) in a ferroelectric material can provide a differential amplification of a voltage signal. Using this principle, the methods and structures provided herein describe a material stack including a ferroelectric layer is employed to introduce the negative capacitance effect. The material stack includes two electrodes, e.g., an upper and lower electrode, in which paraelectric layer and a ferroelectric layer is positioned therebetween. The conductive filaments are formed extending across the entirety of the paraelectric layer and the ferroelectric layer providing a bridge between the upper and lower electrodes.

As will be explained herein, the material compositions and the thickness for the paraelectric layer and the ferroelectric layer may be selected to enable negative capacitance. Further, the material compositions and the thickness for the paraelectric layer and the ferroelectric layer may be selected to allow for simultaneous breakdown of the dielectrics in the formation of the conductive filament.

In one aspect, a memory structure is provided comprising a first electrode and a second electrode at opposing ends of a dielectric stack of a ferroelectric layer and a paraelectric layer. The ferroelectric layer produces a negative capacitance when subjected to an applied voltage and the thickness of the ferroelectric layer and the paraelectric layer allows for simultaneous breakdown of the dielectric material in the ferroelectric layer and the paraelectric layer with the formation of conductive filaments upon being exposed to an electric field produced by the negative capacitance.

In one embodiment, the bottom electrode is a metal nitride. In one example, the metal nitride of the bottom electrode is selected from the group consisting of tantalum nitride, titanium nitride and combinations thereof. In one embodiment, the ferroelectric layer is composed of a hafnium containing oxide. For example, the ferroelectric layer may be composed of hafnium zirconium oxide, hafnium silicon oxide, or hafnium aluminum oxide. In one embodiment, the paraelectric layer is composed of a hafnium containing oxide or a zirconium containing oxide. In one example, the paraelectric layer is composed of hafnium oxide or zirconium oxide. In one embodiment, the top electrode is a metal nitride. In one example, the metal nitride of the top electric is selected from the group consisting of tantalum nitride, titanium nitride and combinations thereof.

In another aspect, an electrical device structure is provided comprising a memory device region and a semiconductor device region. The memory device region includes a memory device. The memory device comprises a first electrode and a second electrode at opposing ends of a dielectric stack of a ferroelectric layer and a paraelectric layer. The ferroelectric layer produces a negative capacitance when subjected to an applied voltage and the thickness of the ferroelectric layer and the paraelectric layer allows for simultaneous breakdown of the dielectric material in the ferroelectric layer and the paraelectric layer with the formation of conductive filaments upon being exposed to an electric field produced by the negative capacitance. The semiconductor device region includes at least one semiconductor device that operates at an operation voltage that is less than the applied voltage that results in the formation of the conductive filaments in the semiconductor device region.

In another aspect, a method of forming a memory device is described that includes forming a ferroelectric layer on a first electrode, and applying an anneal to crystallize the ferroelectric layer. In a following step, a paraelectric layer is formed on the ferroelectric layer and a second electrode is formed on the paraelectric layer. Following, the formation of the second electrode an applied voltage is applied across the first and second electrodes, wherein a negative capacitance effect resulting from the ferroelectric and paraelectric layer amplifies the applied voltage through the ferroelectric layer and the paraelectric layer to form conductive filaments through dielectric breakdown simultaneously through the ferroelectric layer and the paraelectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
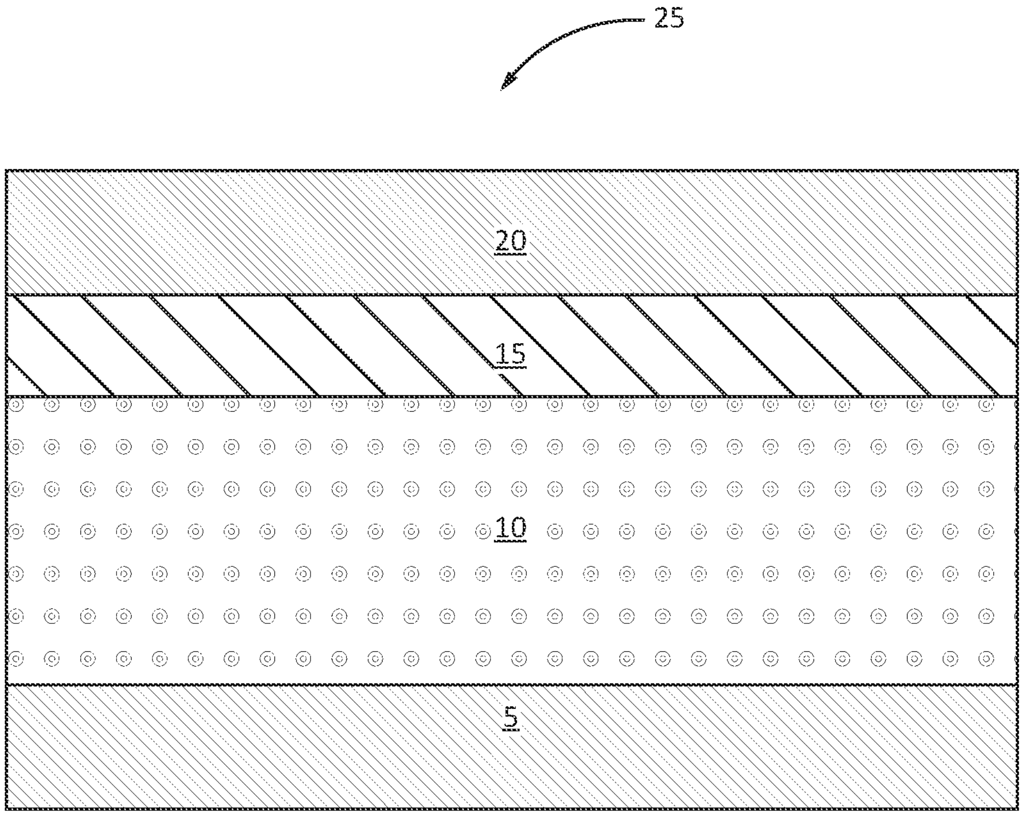
FIG. 1 is a side cross-sectional view of a metal, ferroelectric dielectric layer, paraelectric dielectric layer and metal layer stack for memory device applications, in accordance with one embodiment of the present disclosure, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed to resistive memory devices, e.g., resistive random access memory (RRAM). As used herein, the term "memory device" means a structure in which the electrical state can be altered and then retained in the altered state, in this way a bit of information can be stored. Resistive random-access memory (ReRAM or RRAM) is a type of non-volatile (NV) random-access (RAM) computer memory that works by changing the resistance across a dielectric solid-state material, often referred to as a memristor. Resistive random access memory (ReRAM) devices can be suitable for applications, such as a non-volatile memory, and for use in low voltage, high endurance and high density applications. ReRAM is also suitable for crossbar arrays in neuromorphic applications. Resistive random access memory (RRAM) can be based on the reversible formation/disruption of a conductive filament in a resistive layer providing a low- and a high-resistance states.

The switching of the RRAM cell is based on the growth of conductive filament (CF) inside a dielectric. The CF is a channel having a diameter on the order of nanometers or less, which connects the top and the bottom electrodes of the memory cell. A low resistance state (LRS) with high conductivity is obtained when the filament is connected and the high resistance (HRS) results when the filament is disconnected with a gap between the electrodes. Based on the composition of the conductive filament, RRAM can be classified into the following two types: (i) metal ion-based RRAM also referred to as conductive bridge random access memory (CBRAM) and (ii) oxygen vacancies filament-based RRAM referred to as the 'OxRRAM'. It must be noted here that CBRAM is sometimes referred to as the electrochemical metallization memory (ECM), whereas 'OxRRAM' is sometimes also known as valence change memory (VCM).

Prior to the methods and structures described herein, RRAM devices are formed using a high voltage forming step for producing the current conducting filaments (CF). The forming phenomena is similar to oxide breakdown. The forming phenomena includes the application of a high electric field across the dielectric, e.g., oxide, in which the filament is formed. In some examples, the voltage that is employed to form the filaments is higher than voltage employed in other operations, such as programming and sensing. For example, the voltage for forming filaments can be on the order of 2 volts.

In has been determined, that the voltage used in forming filaments for RRAM devices can have a negative impact on non-volatile memory (NVM) technologies that are integrated with other types of microelectronic devices, such as complementary metal oxide (CMOS) devices that are designed for operation at lower voltages than those used for forming the filaments. For example, a voltage that is employed for forming filaments at a value of 2 volts may have a negative impact on CMOS devices that are designed to operate at 1 volt.

The methods and structures of the present disclosure provide RRAM devices, in which the conductive filaments (CF) are formed at lower voltages. In some embodiments, a lower voltage is enabled for forming conductive filaments through the dielectric layer of a RRAM device by employing negative capacitance to increase the internal voltage of the device to a value that is greater than the actual applied voltage. Using this principle, conductive filaments can be formed in ReRAM memory devices using a lower applied voltage that does not impact the performance of other electrical elements positioned on the same substrate that have lower voltage operation limits. The structures and methods of the present invention are now discussed with greater detail with reference to FIGS. 1-7.

FIG. 1 illustrates one embodiment of material stack including an upper metal layer 20, ferroelectric dielectric layer 10, paraelectric dielectric layer 15 and lower metal layer 5 stack for memory device applications, e.g., ReRAM memory devices 25. The material stack depicted in FIG. 1 may be referred to as a MFIM stack, i.e., Metal (M) (lower metal layer 5), Ferroelectric dielectric layer 10 (F), paraelectric (I) (paraelectric dielectric layer 15), and metal (M) (upper metal layer 20). The ferroelectric dielectric layer 10 is composed of a material that is characterized as having ferroelectricity. "Ferroelectricity" is a property of certain materials that have a spontaneous electric polarization that can be reversed by the application of an external electric field. This polarization may be referred to as permanent. The paraelectric dielectric layer 15 is composed of a material that is characterized as having paraelectricity. "Paraelectricity" is the ability of a material, e.g., ceramic crystals, to become polarized under an applied electric field. Paraelectricity is generally referred to as not being permanent, as the electric field is needed for polarization to remain.

In one embodiment, a memory structure is provided comprising a first electrode (hereafter referred to as a lower metal layer 5), and a second electrode (hereafter referred to as an upper metal layer 20) at opposing ends of a dielectric stack of a ferroelectric layer 10 and a paraelectric layer 15.

The ferroelectric dielectric layer 10 produces a negative capacitance when subjected to an applied voltage and the thickness of the ferroelectric layer 10 and the paraelectric layer 15 allows for simultaneous breakdown of the dielectric material in the ferroelectric layer 10 and the paraelectric layer 15 with the formation of conductive filaments upon being exposed to an electric field produced by the negative capacitance. A "negative capacitance" is negative differential capacitance (NDC) in a ferroelectric material that can provide a differential amplification of a voltage signal. Negative capacitance (NC) in ferroelectrics, which stems from the imperfect screening of polarization, is a viable approach to lower voltage operation.

Using this principle, the methods and structures provided herein describe a material stack including a ferroelectric layer is employed to introduce the negative capacitance effect. In some embodiments, a lower voltage is enabled for forming conductive filaments through the dielectric layer of a RRAM device by employing the negative capacitance to increase the internal voltage of the device to a value that is greater than the actual applied voltage.

The material stack includes two electrodes, e.g., an upper and lower electrode, in which paraelectric layer and a ferroelectric layer is positioned therebetween. The conductive filaments are formed extending across the entirety of the paraelectric layer and the ferroelectric layer providing a bridge between the upper and lower electrodes.

As will be explained herein, the material compositions and the thickness for the paraelectric layer and the ferroelectric layer may be selected to enable negative capacitance. Further, the material compositions and the thickness for the paraelectric layer and the ferroelectric layer may be selected to allow for simultaneous breakdown of the dielectrics in the formation of the conductive filament, which provides the bridge between the upper and lower electrodes described above.

Figure 2:
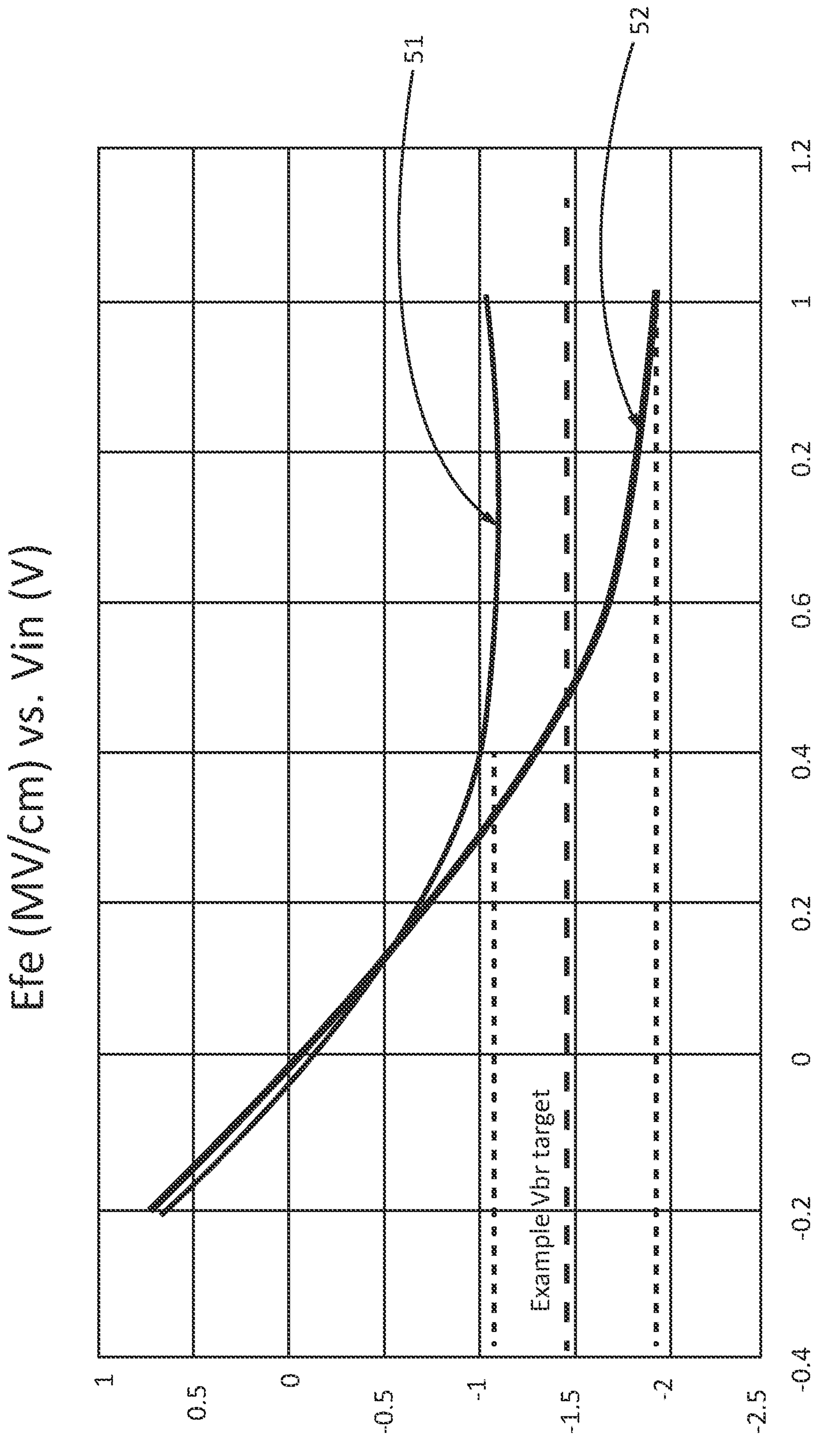
FIG. 2 is a plot illustrating how a negative capacitance effect can amplify an applied voltage to form conductive filaments in a memory device including a MFIM stack, in accordance with one embodiment of the present disclosure.

FIG. 2 is a plot illustrating how a negative capacitance effect can amplify an applied voltage to form conductive filaments in a memory device including a MFIM stack. The plot identified by the lead line having reference number 51 illustrates the electric field Efe (MV/cm) on the Y-axis, and the applied voltage Vin (V) on the x-axis for a RRAM material stack that does not have the above described negative capacitance effect. The plot identified by the lead line having reference number 51 may be referred to as comparative data. The plot identified by the lead line having reference number 52 illustrates the electric field Efe (MV/cm) on the Y-axis, and the applied voltage Vin (V) on the x-axis for a RRAM material stack in which the material compositions for the ferroelectric dielectric layer 10 and the paraelectric dielectric layer 15 and the thickness of these material layers provide a negative capacitance effect that amplifies the input voltage internally, which provides that conductive filaments can be formed at a lower applied voltage. For example, in the plot depicted in FIG. 2, the dashed line designated "Example Vbr target" is minimum electric field on the ferroelectric layer that results in the formation of conductive filaments. When comparing the lead line having reference number 51, i.e., the control data, with the plot line for the RRAM material stack having the above described negative capacitance effect as identified by reference number 52, it is clear that the material stack having the negative capacitance effect can provide conductive filament (CF) formation at lower applied voltages than the control data. This is the result of the voltage amplification at the electric field at the ferroelectric layer. In the example depicted, as identified by reference number 52, an applied voltage (Vin (V)) of 1V to a material stack with material layer compositions and thicknesses that result in negative capacitance produces an electric field (Pr) of approximately −2.0 (MV/cm), which is suitable for conductive filament formation. In the example depicted the lower and upper electrodes 5, 20 may be composed of titanium nitride (TiN). In the example depicted, the dielectric stack includes a paraelectric dielectric layer of zirconium oxide ($ZrO_2$) having a dielectric constant of approximately 20 and a thickness of 4 nm; and a ferroelectric layer of hafnium zirconium oxide ($HfZrO_2$) having a dielectric constant of approximately 17 and a thickness of 8 nm. In the example depicted, as identified by reference number 51, an applied voltage (Vin (V)) of 1V to a material stack that does not result in negative capacitance produces an electric field (Pr) of approximately −1.0 (MV/cm), which is not suitable for conductive filament formation.

In some embodiments, by enabling a lower voltage for forming conductive filaments (CF) through the dielectric layer, e.g., paraelectric dielectric layer 15 and ferroelectric dielectric layer 10, of a ReRAM device by employing negative capacitance to increase the internal voltage of the device to a value that is greater than the actual applied voltage, conductive filaments can be formed in ReRAM memory devices using a lower applied voltage that does not impact the performance of other electrical elements positioned on the same substrate that have lower voltage operation limits.

Figure 3:
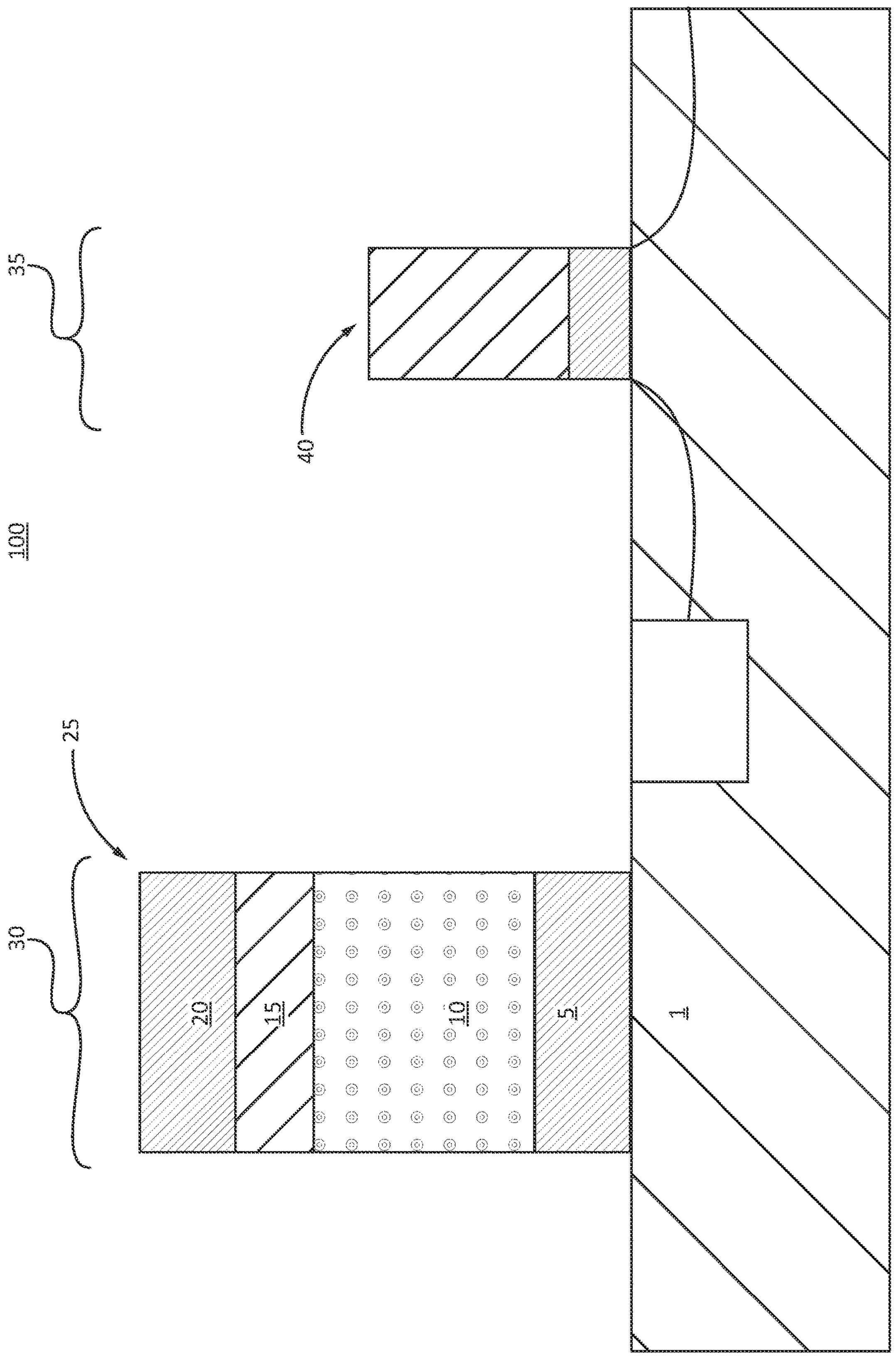
FIG. 3 is a side cross-sectional view of an electrical device including a memory device region including a memory device having a metal, ferroelectric dielectric layer, paraelectric dielectric layer and metal layer stack; and a semiconductor device region includes at least one semiconductor device that operates at an operation voltage that is less than the applied voltage that results in the formation of the conductive filaments in the semiconductor device region.

FIG. 3 illustrates one embodiment of an electrical device 100 including a memory device region 30 including a memory device 25, e.g., ReRAM, having a material stack including an upper metal layer 20, ferroelectric dielectric layer 10, paraelectric dielectric layer 15 and lower metal layer 5; and a semiconductor device region 35 that includes at least one semiconductor device 2540 that operates at an operation voltage that is less than the applied voltage that results in the formation of the conductive filaments in the memory device region 30. The semiconductor device region 35 may include at least one semiconductor device 40 is selected from the group consisting of a planar field effect transistor (FET), a fin type field effect transistor (FinFET), a gate all around FET, a stack nanosheet FET, a vertical field effect transistor (VFET) and combinations thereof.

Referring to FIGS. 1 and 3, the bottom electrode 5 and the top electrode 20 provide the terminals of a two terminal memory stack. In some embodiments, the bottom electrode 5 is a metal nitride. Examples of metal nitrides for the bottom electric 5 include tantalum nitride, titanium nitride and combinations thereof. In one embodiment, the top electrode 20 is also a metal nitride. In one example, the metal nitride of the top electrode is selected from the group consisting of tantalum nitride, titanium nitride and combinations thereof.

In one embodiment, the ferroelectric dielectric layer 10 is composed of a hafnium containing oxide. For example, the ferroelectric dielectric layer 10 may be composed of hafnium zirconium oxide (HfZrO), hafnium silicon oxide (HfSiO), or hafnium aluminum oxide (HfAlO). In one embodiment, the paraelectric dielectric layer 15 is composed of a hafnium containing oxide or a zirconium containing oxide. In one example, the paraelectric dielectric layer 15 is composed of hafnium oxide (HfO) or zirconium oxide (ZrO). The ferroelectric dielectric layer 10 and the paraelectric dielectric layer 15 are configured to provide a series ferroelectric (FE)/dielectric (DE) stack, wherein the maximum internal voltage at the FE/DE interface, in the negative capacitance regime, exceeds the breakdown voltage of both the ferroelectric dielectric layer 10 and the paraelectric dielectric layer 15. The applied external voltage is amplified by the negative capacitance effect; and the internal voltage at the ferroelectric/dielectric films interface is enhanced beyond the applied voltage.

Combinations of materials and properties, e.g., thickness of the layers, can be selected for the ferroelectric dielectric layer 10 and the paraelectric dielectric layer 15 to provide that breakdown, i.e., electroforming of the conducive filaments, of those material layers in forming the conductive filaments occurs by the internal voltage, i.e., the electric field (Efe (MV/cm), measured at the ferroelectric dielectric layer 10 and the paraelectric dielectric layer 15. The internal voltage, i.e., the electric field (Efe (MV/cm), is greater than the applied voltage, because of the amplification provided by the negative capacitance produce by at least the ferroelectric dielectric layer 10. Further, the thicknesses of the ferroelectric dielectric layer 10 and the paraelectric dielectric layer 15 may also be adjusted in combination with the material compositions to provide that both the ferroelectric dielectric layer 10 and the paraelectric dielectric layer 15 experience dielectric breakdown simultaneously, which can provide that a continuous conductive filament extends from the bottom electrode 5 through the ferroelectric dielectric layer 10 and the paraelectric dielectric layer 15 to the upper electrode 20. In some embodiments, the thickness for the ferroelectric dielectric layer 10 is selected to be at least twice the thickness of the paraelectric dielectric layer 15. However, this is only one example, and other thicknesses have been considered, e.g., the thicknesses of the ferroelectric layer 10 and the paraelectric layer 15 may be adjusted to account for the different compositions of these materials and their effect on the negative capacitance.

In one example, a material stack is provided in which the material parameters/film thickness is one of an embodiments enabling electro-forming of conductive filaments at an applied voltage of 1.0V. In this example, the paraelectric dielectric layer 15 is composed of zirconium oxide ($ZrO_2$) having a dielectric constant of 20 (at room temperature, e.g., 20° C.), and a thickness of approximately 4 nm. In this example, the ferroelectric dielectric layer 10 is composed of hafnium zirconium oxide ($HfZrO_2$) having a dielectric constant of 17 (at room temperature, e.g., 20° C.), and a thickness of approximately 8 nm. The upper and lower electrodes 5, 20 may be composed of a metal such as tantalum nitride. In this example, an applied voltage of 1 V can produce and internal field of 2 MV/cm, which is the appropriate internal field for producing dielectric breakdown in both of the paraelectric dielectric layer 15 and the ferroelectric dielectric layer 10 for the above described thicknesses, i.e., a zirconium oxide ($ZrO_2$) paraelectric dielectric layer 15 having a thickness of 4 nm and a hafnium zirconium oxide ($HfZrO_2$) ferroelectric dielectric layer 10 having a thickness of 8 nm. The relationship between an applied external field (Eext) and a polarization charge per unit area (P) can be expressed as follows, with alpha, beta, gamma, and rho being parameters for a ferroelectric material.

$$E_{ext} = 2\alpha P + 4\beta P^3 + 6\gamma P^5 + \rho\frac{dP}{dt}$$

The alpha for the ferroelectric layer described above is 8e10, and the gamma is 1e29. It is noted that this example is provided for illustrative purposes only, and is not intended to limit the present disclosure.

In another aspect, a method of forming a memory device 25 is described that includes forming a ferroelectric dielectric layer 10 on a first electrode 5 (also referred to as lower or bottom electrode 5), and applying an anneal to crystallize the ferroelectric dielectric layer 10. In a following step, a paraelectric dielectric layer 15 is formed on the ferroelectric dielectric layer 10 and a second electrode 20 (also referred to as upper or top electrode 20) is formed on the paraelectric dielectric layer 15. Following, the formation of the second electrode 20 an applied voltage (V1) is applied across the first and second electrodes, wherein a negative capacitance effect resulting from the paraelectric and ferroelectric dielectric layer 15, 10 amplifies the applied voltage through the paraelectric and ferroelectric dielectric layer 15, 10 to form conductive filaments 60 via dielectric breakdown simultaneously through the paraelectric and ferroelectric dielectric layer 15, 10. Some embodiments of a method for forming the memory structure 25, e.g., ReRAM memory structure, that is depicted in FIGS. 1-3, in now described in greater detail with reference to FIGS. 4-7.

Figure 4:
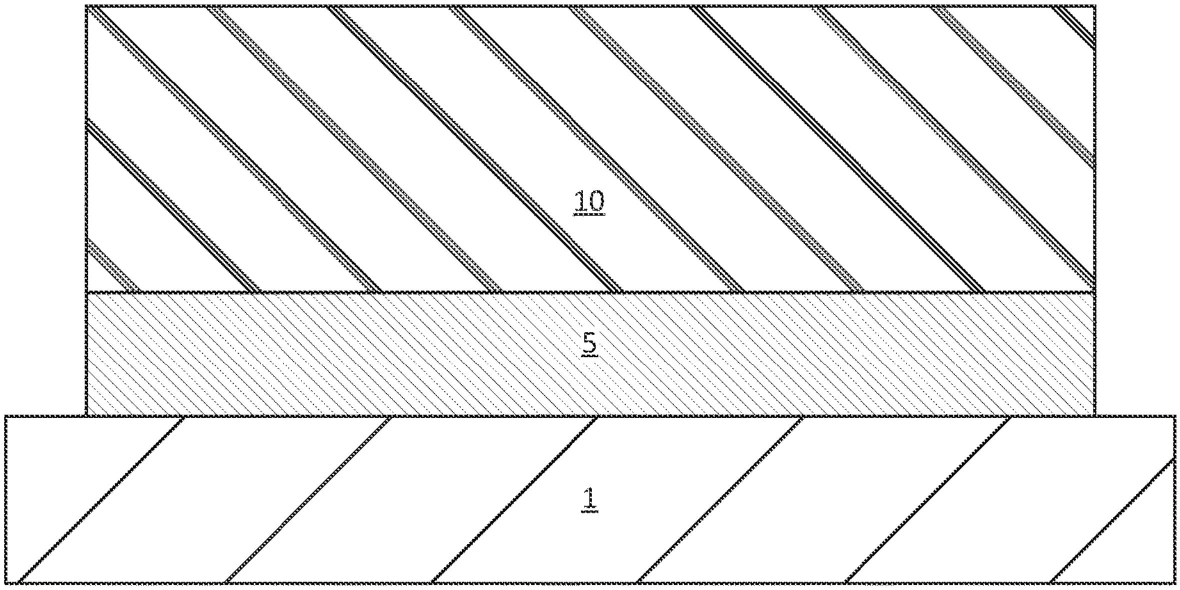
FIG. 4 is a side cross-sectional view of an initial structure used in some embodiments of the present disclosure in which a ferroelectric layer on a first electrode, in accordance with one embodiment of the present disclosure.

FIG. 4 illustrates one embodiment of an initial structure used in some embodiments of the present disclosure in which a ferroelectric dielectric layer 10 on a first electrode 5, in which the first electrode 5 and the ferroelectric dielectric layer 10 are both present on an underlying supporting substrate 1, e.g., a substrate 1 of undoped silicon (Si).

The first electrode 5 may be composed of one or more metal nitride material layers. For example, the first electrode 5 may be composed of a metal nitride, such as titanium nitride (TiN), tantalum nitride (TaN), tungsten nitride (WN) or combinations thereof. In other embodiments, the first electrode 5 may be a multilayered structure including metal nitride layer and aluminum containing layers. For example, the first electrode 5 may also include an aluminum containing alloy layer, e.g., titanium aluminum carbide (TiAlC).

In one example, the first electrode 5 is composed of tantalum nitride (TaN) that is deposited using physical vapor deposition (PVD), or the first electrode 5 is composed of titanium nitride (TiN) that is deposited using chemical vapor deposition (CVD).

The first electrode 5 may be formed directly on the supporting substrate 1.

Still referring to FIG. 4, the ferroelectric dielectric layer 10 may then be formed on the first electrode 5. For example, the ferroelectric dielectric layer 10 is formed using one of physical vapor deposition (PVD), chemical vapor deposition (CVD) or atomic layer deposition (ALD). Atomic Layer Deposition (ALD) is a thin film deposition method in which a film is grown on a substrate by exposing its surface to alternate gaseous species (typically referred to as precursors). In contrast to chemical vapor deposition, the precursors in ALD are not present simultaneously in the reactor, but instead are inserted as a series of sequential, non-overlapping pulses. In each pulse, the precursor molecules react with the surface in a self-limiting way, so that the reaction terminates once all the reactive sites on the surface are consumed. Consequently, the maximum amount of material deposited on the surface after a single exposure to all of the precursors (a.k.a. an ALD cycle) is determined by the nature of the precursor-surface interaction. By varying the number of ALD cycles, it is possible to grow materials uniformly and with high precision on arbitrarily complex and large substrates such as three-dimensional structures.

The ferroelectric dielectric layer 10 may be formed directly on the first electrode 5. The ferroelectric dielectric layer 10 may be composed of a hafnium containing oxide. For example, the ferroelectric dielectric layer 10 may be composed of hafnium zirconium oxide (HfZrO), hafnium silicon oxide (HfSiO), or hafnium aluminum oxide (HfAlO).

Figure 5:
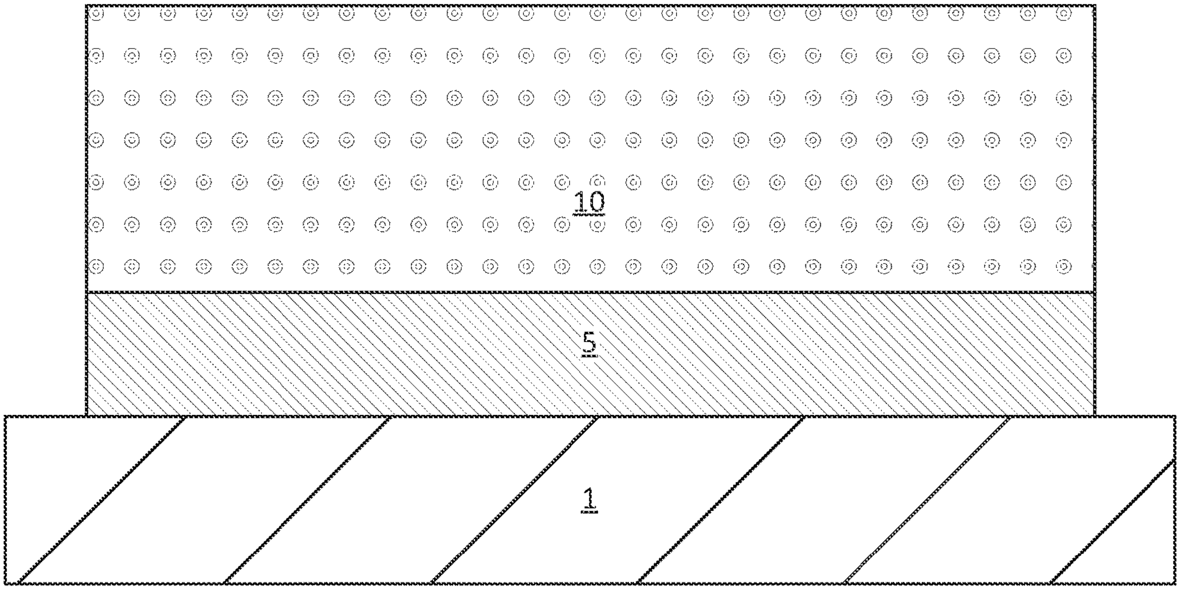
FIG. 5 is a side cross-sectional view of applying an anneal to crystallize the ferroelectric layer, in accordance with one embodiment of the present disclosure.

FIG. 5 depicts applying an anneal to crystallize the ferroelectric dielectric layer 10. This produces a crystalline crystal structure in the ferroelectric dielectric layer 10. The structural origin of ferroelectricity is believed to be the formation of a non-centrosymmetric orthorhombic phase with the space group of Pca21. For example, the ferroelectric dielectric layer 10 may be annealed using rapid thermal annealing (RTA). The temperature for converting the as deposited ferroelectric dielectric layer 10 to the non-centrosymmetric orthorhombic phase with the space group of Pca21 may begin at approximately 400° C. For example, to provide the non-centrosymmetric orthorhombic phase with the space group of Pca21, an as deposited ferroelectric dielectric layer 10 of hafnium zirconium oxide (HfZrO) may be treated with a rapid thermal annealing (RTA) that was performed for 40 seconds at 400° C. with different heating rates in a $N_2$ atmosphere. As described above, the thickness of the ferroelectric dielectric layer 10 may be selected to work with the composition and thickness of the subsequently formed paraelectric dielectric layer 15 to ensure that the combination of the ferroelectric dielectric layer 10 and the paraelectric dielectric layer 15 produces the negative capacitance effect in a manner that induces dielectric breakdown simultaneously in the ferroelectric dielectric layer 10 and the paraelectric dielectric layer 15 at a same internal voltage.

Figure 6:
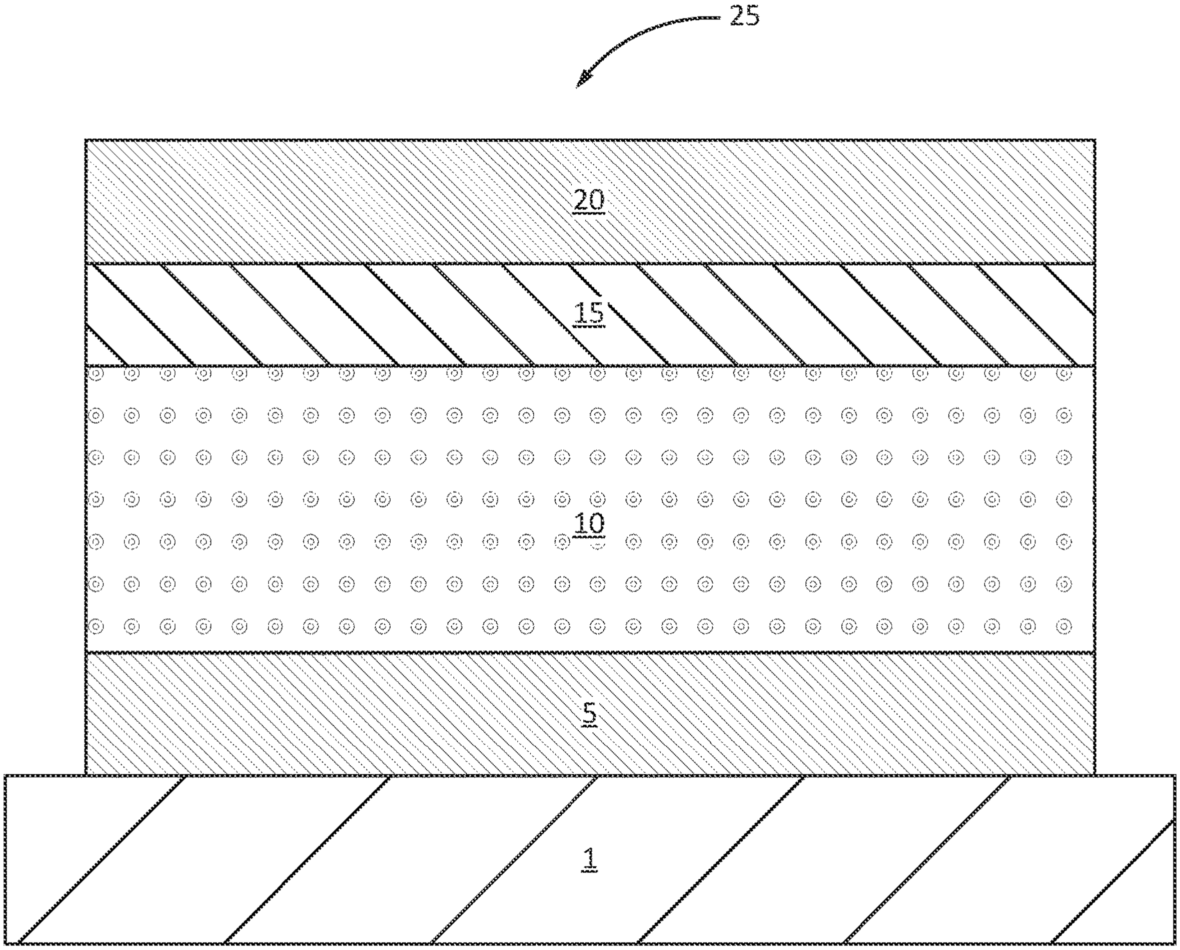
FIG. 6 is a side cross-sectional view of forming a paraelectric layer is formed on the ferroelectric layer and a second electrode is formed on the paraelectric layer, in accordance with one embodiment of the present disclosure.

FIG. 6 depicts forming a paraelectric layer 15 is formed on the ferroelectric layer 10; and a second electrode 20 is formed on the paraelectric layer 15. In one embodiment, the paraelectric dielectric layer 15 is composed of a hafnium containing oxide or a zirconium containing oxide. In one example, the paraelectric dielectric layer 15 is composed of hafnium oxide (HfO) or zirconium oxide (ZrO). The paraelectric dielectric layer 10 may be formed directly on the ferroelectric dielectric layer 15. For example, the paraelectric dielectric layer 10 is formed using one of physical vapor deposition (PVD), chemical vapor deposition (CVD) or atomic layer deposition (ALD).

The ferroelectric dielectric layer 10 and the paraelectric dielectric layer 15 are configured to provide a series ferroelectric (FE)/dielectric (DE) stack, wherein the maximum internal voltage at the FE/DE interface, in the negative capacitance regime, exceeds the breakdown voltage of both the ferroelectric dielectric layer 10 and the paraelectric dielectric layer 15. The applied external voltage is amplified by the negative capacitance effect; and the internal voltage at the ferroelectric/dielectric films interface is enhanced beyond the applied voltage. Combinations of materials and properties, e.g., thickness of the layers, can be selected for the ferroelectric dielectric layer 10 and the paraelectric dielectric layer 15 to provide that breakdown, i.e., electroforming of the conducive filaments, of those material layers in forming the conductive filaments occurs by the internal voltage, i.e., the electric field (Efe (MV/cm), measured at the ferroelectric dielectric layer 10 and the paraelectric dielectric layer 15. The internal voltage, i.e., the electric field (Efe (MV/cm), is greater than the applied voltage, because of the amplification provided by the negative capacitance produced by at least the ferroelectric dielectric layer 10.

As described above, the thickness of the ferroelectric dielectric layer 10 may be selected to work with the composition and thickness of the subsequently formed paraelectric dielectric layer 15 to ensure that the combination of the ferroelectric dielectric layer 10 and the paraelectric dielectric layer 15 produces the negative capacitance effect in a manner that induces dielectric breakdown simultaneously in the ferroelectric dielectric layer 10 and the paraelectric dielectric layer 15 at a same internal voltage.

FIG. 6 also depicts forming the second electrode 20 on the paraelectric layer 15. In one embodiment, the second electrode 20 is composed of a titanium nitride (TiN) or tantalum nitride (TaN). The titanium nitride (TiN) layer for the second electrode 20 can be deposited using chemical vapor deposition (CVD), such as plasma enhanced chemical vapor deposition (PECVD) or metal organic chemical vapor deposition (MOCVD). In other embodiments, the metal composition for the second electrode 20 may be a titanium aluminum carbon containing material, e.g., titanium aluminum carbon (TiAlC) layer.

Figure 7:
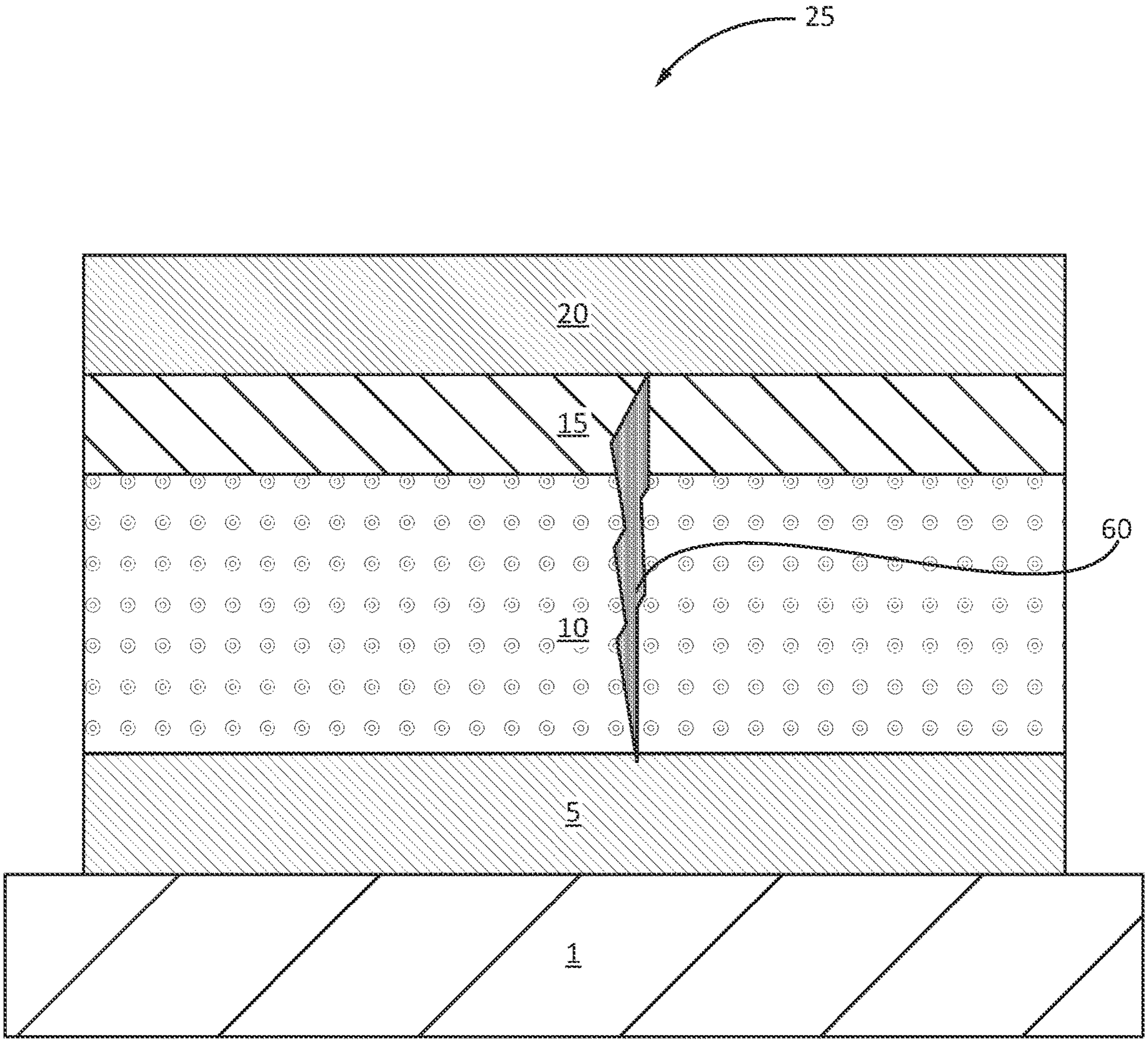
FIG. 7 is side cross-sectional view of applying an applied voltage across the first and second electrodes, wherein a negative capacitance effect resulting from the ferroelectric and paraelectric layer amplifies the applied voltage through the ferroelectric layer and the paraelectric layer to form conductive filaments through dielectric breakdown simultaneously through the ferroelectric layer and the paraelectric layer, in accordance with one embodiment of the present disclosure.

FIG. 7 depicts applying an applied voltage (Vin (V)) across the first and second electrodes 5, 20, wherein a negative capacitance effect resulting from the ferroelectric and paraelectric layer amplifies the applied voltage through the ferroelectric layer and the paraelectric layer. The negative capacitance effect amplifies the applied voltage to form conductive filaments 60 through dielectric breakdown simultaneously through the ferroelectric layer and the paraelectric layer. Additionally, the thickness of the ferroelectric dielectric layer and the paraelectric dielectric layer when appropriately selected facilitates simultaneous breakdown of a dielectric material in each of the ferroelectric dielectric layer and the paraelectric dielectric layer of the dielectric stack. For example, in one embodiment, dielectric breakdown that results in the formation of conducive filaments 60 may occur at an internal voltage that produces a field that is equal to 2 MV/cm. As noted above, in some embodiments, the negative capacitance produced by at least the ferroelectric layer 10, which may function in combination with the paraelectric layer 15, functions to substantially amplify the value of the applied voltage. For example, an applied voltage of 1V can be amplified by the negative capacitance effect to provide an electric field of 2 MV/cm. In this example, because conductive filament formation 60 can occur in each of the ferroelectric dielectric layer 10 and the paraelectric dielectric layer 15 at a value of 2 MV/cm, the applied voltage of 1V can form the conductive filament substantially simultaneously in the ferroelectric dielectric layer 10 and the paraelectric dielectric layer 15. It is noted that both the composition of the ferroelectric dielectric layer 10 and the paraelectric dielectric layer 15, as well as the individual thicknesses for the ferroelectric dielectric layer 10 and the paraelectric dielectric layer 15, can contribute to providing simultaneous formation of the conductive filament through the ferroelectric dielectric layer 10 and the paraelectric dielectric layer 15.

This methods and structures described herein can enable the incorporation of RRAM memory that employs electroforming for dielectric breakdown to produce conductive filaments with semiconductor devices, e.g., CMOS devices, simultaneously on the same substrate, in which the semiconductor devices cannot support high voltages required for electro-forming. As described above, the methods and structures described herein employ material layers that product negative capacitance, in which the negative capacitance amplifies the applied voltage to provide an internal voltage that is suitable for conductive filament formation, without requiring high applied voltages that can negatively impact the semiconductor devices that are simultaneously present on the same substrate as the RRAM structures.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a metal ferroelectric insulator metal stack in a RRAM memory structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory structure comprising:

a dielectric stack of a ferroelectric dielectric layer and a paraelectric dielectric layer, wherein the paraelectric dielectric layer comprises a hafnium containing oxide or a zirconium containing oxide, wherein at least the ferroelectric dielectric layer produces a negative capacitance to amplify an applied voltage, and wherein a thickness of the ferroelectric dielectric layer and a thickness of the paraelectric dielectric layer results in simultaneous breakdown of a dielectric material in each of the ferroelectric dielectric layer and the paraelectric dielectric layer for formation of conductive filaments upon being exposed to an electric field produced by the applied voltage amplified by the negative capacitance;

a first electrode at a first end of the dielectric stack; and a second electrode at a second end of the dielectric stack, wherein the applied voltage is applied to the memory structure through at least one of the first electrode and the second electrode.

2. The memory structure of claim 1, wherein the first electrode is a metal nitride comprising:

tantalum nitride, titanium nitride, or a combination thereof.

3. The memory structure of claim 1, wherein the ferroelectric dielectric layer includes a hafnium containing oxide comprising:

hafnium zirconium oxide, hafnium silicon oxide, or hafnium aluminum oxide.

4. The memory structure of claim 1, wherein the thickness of the ferroelectric dielectric layer is at least twice the thickness of the paraelectric dielectric layer.

5. The memory structure of claim 1, wherein the first electrode includes a metal comprising:

tantalum nitride, titanium nitride, or a combination thereof.

6. An electrical device structure comprising:

a memory device region comprising at least one memory device including a dielectric stack of a ferroelectric dielectric layer and a paraelectric dielectric layer, wherein at least the ferroelectric dielectric layer produces a negative capacitance to amplify an applied voltage that is employed for dielectric breakdown in formation of conductive filaments through the dielectric stack; and a semiconductor device region comprising at least one semiconductor device that operates at an operation voltage that is less than the applied voltage that results in the formation of the conductive filaments in the memory device region.

7. The electrical device structure of claim 6, wherein a thickness of the ferroelectric dielectric layer and a thickness of the paraelectric dielectric layer facilitates simultaneous breakdown of a dielectric material in each of the ferroelectric dielectric layer and the paraelectric dielectric layer of the dielectric stack for the formation of the conductive filaments upon being exposed to an electric field produced by the applied voltage amplified by the negative capacitance.

8. The electrical device structure of claim 6, wherein the at least one memory device is a resistive random access memory (ReRAM) device.

9. The electrical device structure of claim 6, wherein the at least one semiconductor device comprises:

a planar field effect transistor (FET), a fin type field effect transistor (FinFET), a gate all around FET, a stack nanosheet FET, a vertical field effect transistor (VFET), or a combination thereof.

10. The electrical device structure of claim 6, wherein the ferroelectric dielectric layer includes a hafnium containing oxide comprising:

hafnium zirconium oxide, hafnium silicon oxide, or hafnium aluminum oxide.

11. The electrical device structure of claim 6, wherein the paraelectric dielectric layer comprises a hafnium containing oxide or a zirconium containing oxide.

12. The electrical device structure of claim 6, wherein a thickness of the ferroelectric dielectric layer is at least twice a thickness of the paraelectric dielectric layer.

13. The electrical device structure of claim 6, wherein the at least one memory device comprises an electrode having a metal nitride composition comprising:

tantalum nitride, titanium nitride, or a combination thereof.

* * * * *